United States Patent
Han et al.

(10) Patent No.: US 10,394,302 B2
(45) Date of Patent: Aug. 27, 2019

(54) SELF-SERVICE EQUIPMENT ENERGY SAVING CONTROL METHOD AND DEVICE

(71) Applicant: GRG BANKING EQUIPMENT CO., LTD., Guangzhou, Guangdong (CN)

(72) Inventors: Xiaoping Han, Guangdong (CN); Jiachun Zheng, Guangdong (CN); Zheng Xiao, Guangdong (CN); Jinjun He, Guangdong (CN)

(73) Assignee: GRG BANKING EQUIPMENT CO., LTD., Guangzhou, Guangdong (CN)

( * ) Notice: Subject to any disclaimer, the term of this patent is extended or adjusted under 35 U.S.C. 154(b) by 0 days.

(21) Appl. No.: 15/772,061

(22) PCT Filed: Jul. 29, 2016

(86) PCT No.: PCT/CN2016/092306
§ 371 (c)(1),
(2) Date: Apr. 28, 2018

(87) PCT Pub. No.: WO2017/084385
PCT Pub. Date: May 26, 2017

(65) Prior Publication Data
US 2018/0314310 A1  Nov. 1, 2018

(30) Foreign Application Priority Data
Nov. 16, 2015  (CN) .......................... 2015 1 0789025

(51) Int. Cl.
*G06F 1/00* (2006.01)
*G06F 1/26* (2006.01)
(Continued)

(52) U.S. Cl.
CPC ............ *G06F 1/3206* (2013.01); *G06F 17/50* (2013.01); *G06N 7/005* (2013.01); *G06Q 10/04* (2013.01);
(Continued)

(58) Field of Classification Search
CPC ........................................................ G06F 1/32
See application file for complete search history.

(56) References Cited

U.S. PATENT DOCUMENTS 7,174,468 B2 * 2/2007 Gary .................... G06F 1/26
713/300
8,227,936 B1  7/2012 Folk et al.
(Continued)

FOREIGN PATENT DOCUMENTS

CN  1700146 A  11/2005
CN  102012735 A  4/2011
(Continued)

OTHER PUBLICATIONS

International Search Report for PCT/CN2016/092306, dated Oct. 28, 2016, ISA/CN.
(Continued)

*Primary Examiner* — Mohammed H Rehman
(74) *Attorney, Agent, or Firm* — Apex Attorneys at Law, LLP; Yue (Robert) Xu

(57) ABSTRACT

Provided are an energy-saving control method and device for a self-service device. The method includes: acquiring to-be-learned sample information from historical usage data of users of the self-service device, where the sample information indicates the number of users which use the self-service device in each of different sub-periods of a period of time; learning the to-be-learned sample information by using a preset Bayesian prior probability model, to obtain a learning result; updating the Bayesian prior probability model based on the learning result; predicting the number of users in each of sub-periods of a preset period of time by using the updated Bayesian prior probability model, to obtain the predicted number of users at the self-service device; and modifying a sleep interval of the self-service device in each of the sub-periods based on the predicted number of users.

9 Claims, 4 Drawing Sheets

(51) Int. Cl.
*G06F 1/32* (2019.01)
*G06F 1/3206* (2019.01)
*G06F 17/50* (2006.01)
*G07F 19/00* (2006.01)
*G06Q 10/04* (2012.01)
*G06N 7/00* (2006.01)

(52) U.S. Cl.
CPC ............ *G07F 19/20* (2013.01); *G07F 19/206* (2013.01); *G07F 19/209* (2013.01)

(56) References Cited

U.S. PATENT DOCUMENTS

| | | | | |
|---|---|---|---|---|
| 8,281,166 | B2* | 10/2012 | Carroll | G06F 1/3203 713/310 |
| 9,535,895 | B2* | 1/2017 | Gershnik | G06F 17/275 |
| 2003/0204758 | A1 | 10/2003 | Singh | |
| 2004/0064531 | A1 | 4/2004 | Wisner | |
| 2004/0064731 | A1* | 4/2004 | Nguyen | H04L 41/046 726/22 |
| 2005/0021485 | A1* | 1/2005 | Nodelman | G06Q 10/109 706/21 |
| 2007/0022075 | A1* | 1/2007 | Horvitz | G06F 8/35 706/52 |
| 2008/0033786 | A1* | 2/2008 | Boaz | G06F 17/50 705/7.31 |
| 2009/0142089 | A1* | 6/2009 | Kouno | G03G 15/5004 399/79 |
| 2011/0296217 | A1 | 12/2011 | Nishimura et al. | |
| 2013/0123004 | A1* | 5/2013 | Kruglick | A63F 13/50 463/29 |
| 2013/0265432 | A1 | 10/2013 | Freedman et al. | |
| 2013/0295963 | A1* | 11/2013 | Sen | H04W 4/21 455/456.3 |
| 2014/0185506 | A1 | 7/2014 | Yang et al. | |
| 2015/0112501 | A1* | 4/2015 | Rombouts | G05F 1/66 700/295 |
| 2016/0337686 | A1* | 11/2016 | Maker, III | H04N 21/42206 |
| 2017/0018923 | A1* | 1/2017 | Rombouts | G05B 17/02 |

FOREIGN PATENT DOCUMENTS

| | | |
|---|---|---|
| CN | 102625425 A | 8/2012 |
| CN | 102662325 A | 9/2012 |
| CN | 102662748 A | 9/2012 |
| CN | 102869079 A | 1/2013 |
| CN | 103490956 A | 1/2014 |
| CN | 104093197 A | 10/2014 |
| CN | 104298881 A | 1/2015 |
| CN | 104794536 A | 7/2015 |
| CN | 105468823 A | 4/2016 |
| RU | 2565049 C2 | 10/2015 |
| WO | 2014117861 A1 | 8/2014 |

OTHER PUBLICATIONS

Wang, Jian et al. "Short-Term Freway Traffic Flow Prediction Based on Multiple Methods with Bayesian Network", Journal of Transportation Systems Engineering and Information Technology, vol. 11 No. 4, Aug. 15, 2011, pp. 147-153.
Anonymous: "Bayesian probability-Wikipedia",Nov. 4, 2015, XP055501363, Retrieved from the Internet.
Search Report dated Sep. 3, 2018 for European patent application No. 16865563.7, 9 pages.
Russian First Office Action dated Mar. 7, 2019.

\* cited by examiner

SELF-SERVICE EQUIPMENT ENERGY SAVING CONTROL METHOD AND DEVICE

This application is a national phase application of PCT international patent application PCT/CN2016/092306, filed on Jul. 29, 2016 which claims priority to Chinese Patent Application No. 201510789025.9, titled "SELF-SERVICE EQUIPMENT ENERGY SAVING CONTROL METHOD AND DEVICE", and filed with the Chinese State Intellectual Property Office on Nov. 16, 2015, both of which are incorporated herein by reference in their entireties.

FIELD

The present disclosure relates to the technical field of a self-service device, and particularly to an energy-saving control method and an energy-saving control device for the self-service device.

BACKGROUND

With the rapid development of the society, science and technology is applied to all trades and professions, including the financial field. The ATM is an important application of the science and technology. The ATM refers to small machines deployed at different locations by the bank. Through the ATM, the user uses a bank card to enjoy counter services such as self-service deposit, self-service withdrawal and self-service transfer. With the application of the ATM, cumbersome operations including taking a number and going to the counter are unnecessary for the user when handling the above counter services, thereby reducing the stress of counter staffs, saving the time and improving the efficiency.

However, energy consumption caused by a large number of ATMs becomes a heavy burden for the bank. The existing ATMs have a fixed sleep interval, and the length of the sleep interval is set by the bank or the manufactures of the ATMs. In a case where the ATM is set to enter a sleep state after the ATM is not used for a short time, the ATM enters the sleep state or a start state frequently in a time period of heavy business, resulting in great damage for the ATM, a high fault rate and high maintenance cost of the ATM. In a case where the ATM is set to enter a sleep state after the ATM is not used for a long time, the ATM does not enter the sleep state after a long time in a time period (such as early morning) of less business, resulting in the high electricity consumption.

SUMMARY

An Energy-saving control method and an energy-saving control device for a self-service device are provided according to the embodiments of the present disclosure, to solve problems that the self-service device enters a sleep state or a start state repeatedly in a case of a large number of users due to a too-short sleep interval, and that resources are wasted in a case of a small number of users due to a too-long sleep interval.

An energy-saving control method for a self-service device is provided according to an embodiment of the present disclosure. The method includes: acquiring to-be-learned sample information from historical usage data of users of the self-service device, where the sample information indicates the number of users which use the self-service device in each of different sub-periods of a period of time; learning the to-be-learned sample information by using a preset Bayesian prior probability model, to obtain a learning result; updating the Bayesian prior probability model based on the learning result; predicting the number of users in each of sub-periods of a preset period of time by using the updated Bayesian prior probability model, to obtain the predicted number of users at the self-service device; and modifying a sleep interval of the self-service device in each of the sub-periods based on the predicted number of users.

Optionally, the Bayesian prior probability model is obtained by the following preprocessing steps: preprocessing the historical usage data of the users of the self-service device, to acquire the number of users which use the self-service device in each of the different sub-periods of the period of time as sample information; collating the sample information based on division for the period of time, to obtain prior sample information; and obtaining the Bayesian prior probability model based on Bayes rules and the prior sample information.

Optionally, the to-be-learned sample information is updated into the prior sample information once the to-be-learned sample information is acquired.

Optionally, the Bayesian prior probability model $P(x_s)$ is represented as:

$$P(x_s) = Dir(\alpha_1, \alpha_2, \cdots, \alpha_s) = \frac{\Gamma(\alpha)}{\prod_s \Gamma(\alpha_s)} \prod_s (x_s)^{\alpha_s - 1},$$

where $Dir(\alpha_1, \alpha_2, \ldots, \alpha_s)$ denotes a dirichlet distribution, s denotes the number of the sub-periods of the period of time, $x_s$ denotes the number of users in the sample information in an s-th sub-period, $\alpha_s$ denotes the number of pieces of the sample information in the s-th sub-period, and $$\alpha = \sum_{s=1}^{s} \alpha_s.$$

Optionally, the updated Bayesian prior probability model $P'(x_s)$ is represented as:

$$P'(x_s) = \frac{x_s + x'_s}{n} = \frac{x_s + x'_s}{\sum_{s=1}^{s}(x_s + x'_s)},$$

and
the number of pieces of the updated sample information is represented as:

$$n = \sum_{s=1}^{s}(x_s + x'_s); x_s, x'_s = 0, 1, 2, \cdots, m,$$

where $x'_s$ denotes the number of users in the to-be-learned sample information in each of the sub-periods, and $x_s$ denotes the number of users in the sample information in the s-th sub-period.

Optionally, a sleep state corresponding to the sleep interval of the self-service device is modified when the sleep interval of the self-service device in each of the sub-periods is modified based on the predicted number of users.

Optionally, the modifying the sleep interval and the sleep state corresponding to the sleep interval of the self-service device in each of the sub-periods based on the predicted number of users includes: acquiring the sum of durations of all of the users using the self-service device; calculating an average duration of the user using the self-service device based on the sum of durations; acquiring a predicted total usage duration based on the predicted number of users and the average duration; calculating an average idle interval between two adjacent usage for the self-service device within the preset period of time based on the predicted total usage duration; and modifying, based on the average idle interval, the sleep interval and the sleep state corresponding to the sleep interval of the self-service device in each of the sub-periods of the self-service device.

Optionally, the modifying, based on the average idle interval, the sleep interval and the sleep state corresponding to the sleep interval of the self-service device in each of the sub-periods includes: in a case where the average idle interval is less than a first preset time threshold, controlling the self-service device not to enter a sleep state; in a case where the average idle interval is greater than or equal to the first preset time threshold and is less than a second preset time threshold, and the self-service device is not used within a first preset sleep interval, controlling the self-service device to enter a light sleep state, where in the light sleep state, a screen of the self-service device is turned off, and a main device of the self-service device is maintained operating normally; and in a case where the average idle interval is greater than the second preset time threshold, controlling the self-service device to enter the light sleep state in a case where the self-service device is not used within the first preset sleep interval, and controlling the self-service device to enter a deep sleep state in a case where a duration in which the self-service device is in the light sleep state is greater than a second preset sleep interval, where in the deep sleep state, the screen of the self-service device is turned off and the main device of the self-service device enters a lowest power consumption operation state.

Optionally, the modifying, based on the average idle interval, the sleep interval and the sleep state corresponding to the sleep interval of the self-service device in each of the sub-periods further includes: controlling the self-service device to enter the deep sleep state in a case where a current time is in a range of the preset period of time and the self-service device is not used within a third preset sleep interval.

An energy-saving control device for a self-service device is provided according to an embodiment of the present disclosure, which includes: a sample information acquiring module configured to acquire to-be-learned sample information from historical usage data of users of the self-service device, where the sample information indicates the number of users which use the self-service device in each of different sub-periods of a period of time; a learning module configured to learn the to-be-learned sample information by using a preset Bayesian prior probability model, to obtain a learning result; an updating module configured to update the Bayesian prior probability model based on the learning result; a predicting module for the number of users configured to predict the number of users in each of sub-periods of a preset period of time by using the updated Bayesian prior probability model, to obtain the predicted number of users at the self-service device; and a sleep modifying module configured to modify a sleep interval in each of the sub-periods of the self-service device based on the predicted number of users.

It can be seen from the above technical solutions that the embodiments of the present disclosure have the following advantages.

In the embodiments of the present disclosure, firstly, to-be-learned sample information is acquired from historical usage data of users of the self-service device. The sample information indicates the number of users which use the self-service device in each of different sub-periods of a period of time. Secondly, the to-be-learned sample information is learned using a preset Bayesian prior probability model to obtain a learning result. Thirdly, the Bayesian prior probability model is updated based on the learning result. Fourthly, the number of users in each of sub-periods of a preset period of time is predicted using the updated Bayesian prior probability model, to obtain the predicted number of users at the self-service device. Finally, a sleep interval of the self-service device in each of the sub-periods is modified based on the predicted number of users. In the embodiments of the present disclosure, the number of users are predicted using the Bayesian prior probability model obtained by self-learning, and the sleep interval of the self-service device in each of the sub-periods is modified based on the predicted number of users. The sleep interval of the self-service device in each of the sub-periods may be set properly as required, thereby avoiding the problems that the self-service device enters a sleep state or a start state repeatedly in a case of a large number of users due to a too-short sleep interval, and that resources are wasted in a case of a small number of users due to a too-long sleep interval.

BRIEF DESCRIPTION OF THE DRAWINGS

In order to more clearly illustrate technical solutions of the present disclosure or the conventional technology, the drawings required in description of the embodiments and the conventional technology are briefly described below. Apparently, the drawings in the following description are only some embodiments of the present disclosure, and other drawings may be obtained by those skilled in the art based on these drawings without any creative work.

DETAILED DESCRIPTION OF EMBODIMENTS

An energy saving control method and an energy saving control device for a self-service device are provided according to the embodiments of the present disclosure, to solve the problems that the self-service device enters a sleep state or a start state repeatedly in a case of a large number of users due to a too-short sleep interval, and that resources are wasted in a case of a small number of users due to a too-long sleep interval.

In order to make the objectives, features and advantages of the present disclosure more apparent and easier to be understood, the technical solutions according to the embodiments of the present disclosure are described clearly and completely as follows in conjunction with the drawings in the embodiments of the present disclosure. Apparently, the described embodiments below are only a part rather than all of the embodiments of the present disclosure. Any other embodiments obtained by those skilled in the art based on the embodiments of the present disclosure without any creative work fall within the protection scope of the present disclosure.

Figure 1:
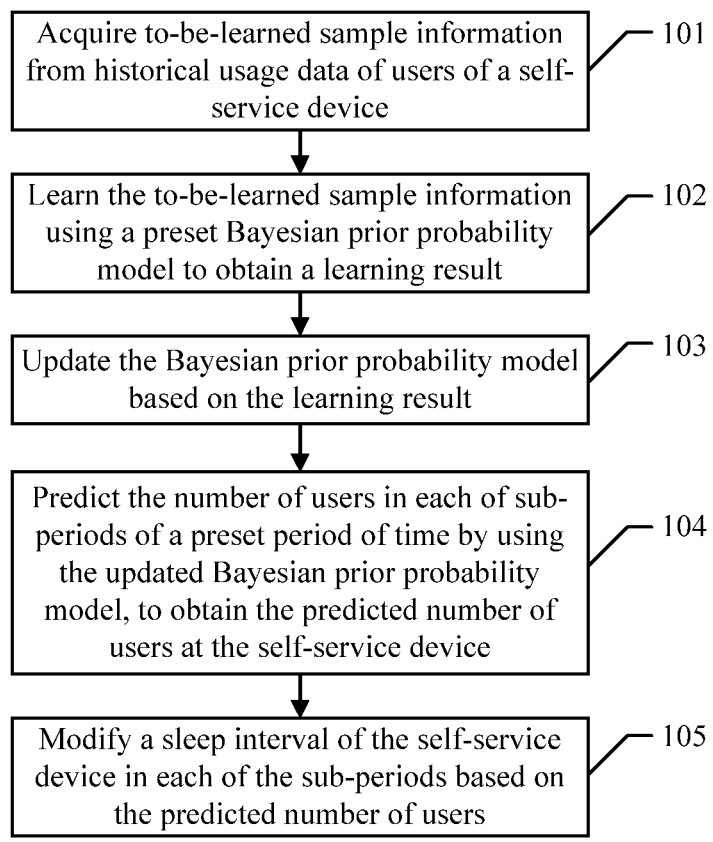
FIG. 1 is a flowchart of an energy-saving control method for a self-service device according to an embodiment of the present disclosure.

With reference to FIG. 1, an energy-saving control method for a self-service device according to an embodiment of the present disclosure includes steps 101 to 105.

In step 101, to-be-learned sample information is acquired from historical usage data of users of the self-service device.

Firstly, the to-be-learned sample information is acquired from the historical usage data of the users of the self-service device. The sample information indicates the number of users which use the self-service device in each of different sub-periods of a period of time.

In step 102, the to-be-learned sample information is learned using a preset Bayesian prior probability model, to obtain a learning result.

After the to-be-learned sample information is acquired from the historical usage data of the users of the self-service device, the to-be-learned sample information may be learned using the preset Bayesian prior probability model to obtain the learning result.

In step 103, the Bayesian prior probability model is updated based on the learning result.

After the to-be-learned sample information is learned using the preset Bayesian prior probability model to obtain the learning result, the Bayesian prior probability model may be updated based on the learning result.

In step 104, the number of users in each of sub-periods of a preset period of time is predicted using the updated Bayesian prior probability model, to obtain the predicted number of users at the self-service device.

After the Bayesian prior probability model is updated based on the learning result, the number of users in each of the sub-periods of the preset period of time may be predicted using the updated Bayesian prior probability model, to obtain the predicted number of users at the self-service device.

In step 105, a sleep interval of the self-service device in each of the sub-periods is modified based on the predicted number of users.

After the number of users in each of the sub-periods of the preset period of time is predicted using the updated Bayesian prior probability model to obtain the predicted number of users at the self-service device, the sleep interval of the self-service device in each of the sub-periods may be modified based on the predicted number of users.

In the embodiment, firstly, to-be-learned sample information is acquired from historical usage data of users of the self-service device. The sample information indicates the number of users which use the self-service device in each of different sub-periods of a period of time. Secondly, the to-be-learned sample information is learned using a preset Bayesian prior probability model to obtain a learning result. Thirdly, the Bayesian prior probability model is updated based on the learning result. Fourthly, the number of users in each of sub-periods of a preset period of time is predicted using the updated Bayesian prior probability model, to obtain the predicted number of users at the self-service device. Finally, a sleep interval of the self-service device in each of the sub-periods is modified based on the predicted number of users. In the embodiment, the number of users is predicted using the Bayesian prior probability model obtained by self-learning, and the sleep interval of the self-service device in each of the sub-periods is modified based on the predicted number of users. The sleep interval of the self-service device in each of the sub-periods may be set properly as required, thereby avoiding the problems that the self-service device enters a sleep state or a start state repeatedly in a case of a large number of users due to a too-short sleep interval, and that resources are wasted in a case of a small number of users due to a too-long sleep interval.

Figure 2:
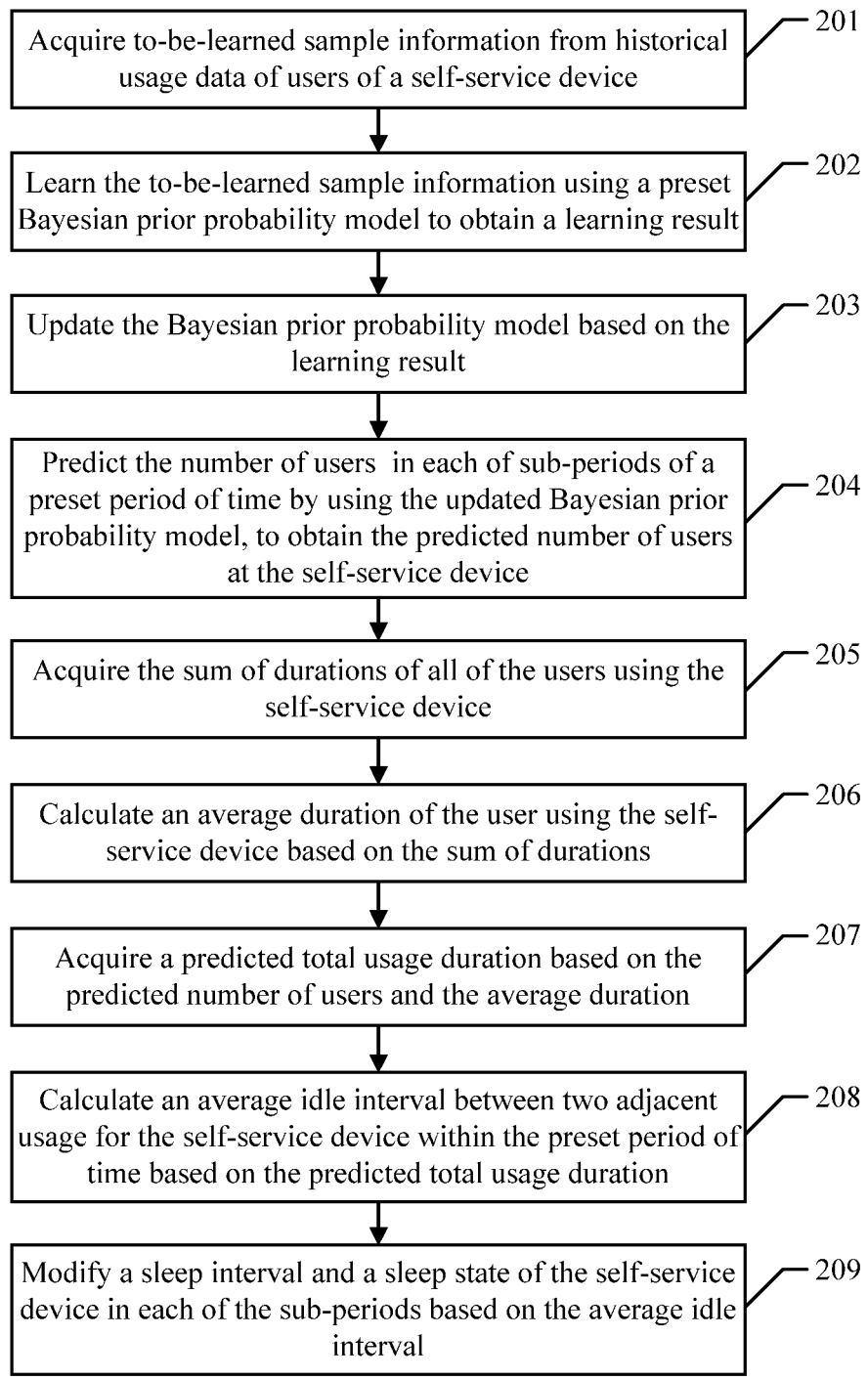
FIG. 2 is a flowchart of an energy-saving control method for a self-service device according to another embodiment of the present disclosure.

For ease of understanding, the energy-saving control method for the self-service device according to the embodiment of the present disclosure is described in detail below. With reference to FIG. 2, an energy-saving control method for a self-service device according to another embodiment of the present disclosure includes steps 201 to 209.

In step 201, to-be-learned sample information is acquired from historical usage data of users of the self-service device.

Firstly, the to-be-learned sample information may be acquired from the historical usage data of the users of the self-service device. The sample information indicates the number of users which use the self-service device in each of different sub-periods of a period of time. That is, it can be understood that a user from a time when the user starts using the self-service device to a time when the user finishes using the self-service device in a period of time (an integer multiple of 24 hours) may be considered as one user in the to-be-learned sample information. The number of users in the to-be-learned sample information may be collated according to a sub-period, to obtain the collated to-be-learned sample information. The length of the sub-period may be one hour, two hours or more hours.

Hereinafter, the to-be-learned sample information and prior sample information are collated according to the sub-period of one hour.

For example, the obtained collated to-be-learned sample information $D_1$ is represented as:

$$D_1 = \{x'_1, x'_2, \ldots, x'_s\},$$

where s denotes a sequence number of the sub-period, a value range of s meets s≤24, s can be divisible by 24, and a value of s is 1, 2, . . . , 24 in a case where the length of the sub-period is one hour, $x'_s$ denotes the number of users in the to-be-learned sample information in an s-th sub-period, and $x'_s = 0, 1, 2, \ldots$ m.

In a case where the to-be-learned sample information is collated according to the sub-period of two hours, a value of s is 1, 2, . . . , 12.

For example, the obtained collated prior sample information D is represented as:

$$D = \{x_1, x_2, \ldots, x_s\},$$

where s denotes a sequence number of the sub-period, a value range of s meets s≤24, s can be divisible by 24, and a value of s is 1, 2, . . . , 24 in a case where the length of the sub-period is one hour, $x_s$ denotes the number of users in the prior sample information in an s-th sub-period, and $x_s = 0, 1, 2, \ldots$ m.

In a case where the prior sample information is collated according to the sub-period of two hours, a value of s is 1, 2, . . . , 12.

In step 202, the to-be-learned sample information is learned using a preset Bayesian prior probability model, to obtain a learning result.

After the to-be-learned sample information is acquired from the historical usage data of the users of the self-service device, the to-be-learned sample information may be learned using the preset Bayesian prior probability model, to obtain the learning result.

It should be noted that the Bayesian prior probability model may be acquired by the following preprocessing steps A to C.

In step A, the historical usage data of the users of the self-service device is preprocessed, to acquire different durations in which different users use the self-service device within a day as sample information.

In step B, the sample information is collated based on division for the period of time to obtain prior sample information.

In step C, the Bayesian prior probability model is obtained based on Bayes rules and the prior sample information.

It should be noted that the to-be-learned sample information may be updated into the prior sample information once the to-be-learned sample information is acquired.

In step 203, the Bayesian prior probability model is updated based on the learning result.

After the learning result is obtained, the Bayesian prior probability model may be updated based on the learning result.

It should be noted that the collated to-be-learned sample information is learned using the Bayesian prior probability. A time interval for learning the collated to-be-learned sample information may be one or more days, which depends on the amount of usage of the self-service device at the site.

For example, it is assumed that the time interval is a day, a process of learning the collated to-be-learned sample information by using the Bayesian prior probability is described in detail.

For the obtained collated prior sample information described as an example in step 201, the total number n of pieces of the prior sample information can be obtained as follows.

$$n = \sum_{s=1}^{24} x_s, x_s = 0, 1, 2, \cdots, m;$$

where 24 in the above equation is changed to 12 in a case where the length of the sub-period is two hours.

Therefore, a Bayesian prior probability $P(x_s)$ for the number of users of the ATM in each of the sub-periods is represented as:

$$P(x_s) = \frac{x_s}{n} = \frac{x_s}{\sum_{s=1}^{24} x_s}, x_s = 0, 1, 2, \cdots, m;$$

where 24 in the above equation is changed to 12 in a case where the length of the sub-period is two hours.

Since there are continuous and multivariate users using the self-service device, the Bayesian prior probability model $P(x_s)$ in each of the sub-periods obeys the Dirichlet distribution $Dir(\alpha_1, \alpha_2, \ldots, \alpha_s)$, that is:

$$P(x_s) = Dir(\alpha_1, \alpha_2, \cdots, \alpha_s) = \frac{\Gamma(\alpha)}{\prod_s \Gamma(\alpha_s)} \prod_s (x_s)^{\alpha_s - 1};$$

where $Dir(\alpha_1, \alpha_2, \ldots, \alpha_s)$ denotes the Dirichlet distribution, s denotes the number of the sub-periods of a day, $x_s$ denotes the number of users in the sample information in an s-th sub-period, $\alpha_s$ denotes the number of pieces of the sample information in the s-th sub-period, and $$\alpha = \sum_{s=1}^{s} \alpha_s.$$

A prior sample probability P(D) is represented as:

$$P(D) = \int P(x_s) P(D|x_s) dx_s;$$

The to-be-learned sample information is learned, and the following equation can be obtained according to the Bayesian formula.

$$P(x_s | D) = \frac{P(x_s)P(D|x_s)}{\int P(x_s)P(D|x_s)dx_s} = \frac{P(x_s)P(D|x_s)}{P(D)};$$

where $P(x_s)$ denotes a Bayesian prior probability distribution for $x_s$, $P(x_s|D)$ denotes a Bayesian posterior probability distribution for $x_s$, and a learned Bayesian prior probability $P'(x_s)$ may be obtained as follows by converting $P(x_s|D)$ to the dirichlet distribution $Dir(\alpha_1+\beta_1, \alpha_2+\beta_2, \ldots, \alpha_s+\beta_s)$.

$$P'(x_s) = \frac{x_s + x'_s}{\sum_{s=1}^{24}(x_s + x'_s)}; x_s, x'_s = 0, 1, 2, \cdots, m;$$

where 24 in the above equation is changed to 12 in a case where the length of the sub-period is two hours, $\beta_1, \beta_2, \ldots, \beta_s$ denotes the dirichlet distribution of the collated to-be-learned sample information in sub-periods for $x'_s$, $x'_s$ denotes the number of users in the updated sample in each sub-period, and $x'_s = 0, 1, 2, \ldots, m$. The original Bayesian prior probability is updated by the learned Bayesian prior probability.

The total number n of pieces of the collated prior sample information may also be updated as $$n = \sum_{s=1}^{24}(x_s + x'_s);$$

$x_s, x'_s = 0, 1, 2, \ldots, m$, where 24 in the this equation is changed to 12 in a case where the length of the sub-period is two hours.

In step 204, the number of users in each of sub-periods of a preset period of time is predicted using the updated Bayesian prior probability model, to obtain the predicted number of users at the self-service device.

After the Bayesian prior probability model is updated based on the learning result, the number of users in each of the sub-periods in the preset period of time may be predicted using the updated Bayesian prior probability model, to obtain the predicted number of users at the self-service device, which is described in detail below.

The number of users in each of sub-periods of a period of time is predicted using the updated Bayesian prior probability model. The period of time may be determined based on the interval for learning the collated to-be-learned sample information.

How to predict the number of users in each of sub-periods of the next day is described in detail below.

A probability of occurrence of users in each of sub-periods of the next day is predicted using the updated Bayesian prior probability, to predict the number of users which use the self-service device in each of the sub-periods.

The Bayesian prior probability model is updated based on the learned Bayesian prior probability P'($x_s$), to obtain the updated Bayesian prior probability model P($x_s$) as follows.

$$P(x_s) = \frac{x_s}{n} = \frac{x_s}{\sum_{s=1}^{24} x_s}, x_s = 0, 1, 2, \cdots, m,$$

where $x_s$ is fused into $x'_s$ to generate the prior sample information, and 24 in the above equation is changed to 12 in a case where the length of the sub-period is two hours.

Therefore, the number of users which use the self-service device in the s-th sub-period can be predicted, and the number Y of users which use the ATM in the s-th sub-period is obtained as follows.

$$y = P(x_s) \cdot n,$$

where n denotes the total number of updated samples, that is, the number of users using the self-service device, P($x_s$) denotes the updated Bayesian prior probability model. In this way, the number of users which use the self-service device in the S-th sub-period can be obtained.

In step 205, the sum of durations of all of the users using the self-service device is acquired.

The sum of durations of all of the users using the self-service device may be acquired after the predicted number of users at the self-service device is obtained.

In step 206, an average duration of the user using the self-service device is calculated based on the sum of durations.

After the sum of durations of all of users using the self-service device is acquired, the average duration of the user using the self-service device may be calculated based on the sum of durations.

In step 207, a predicted total usage duration is acquired based on the predicted number of users and the average duration.

After the average duration of the user using the self-service device is calculated based on the sum of durations, the predicted total usage duration may be acquired based on the predicted number of users and the average duration.

In step 208, an average idle interval between two adjacent usage for the self-service device within the preset period of time is calculated based on the predicted total usage duration.

After the predicted total usage duration is acquired based on the predicted number of users and the average duration, the average idle interval between two adjacent usage for the self-service device within the preset period of time may be calculated based on the predicted total usage duration.

In step 209, a sleep interval and a sleep state of the self-service device in each of the sub-periods are modified based on the average idle interval.

After the average idle interval between two adjacent usage for the self-service device within the preset period of time is calculated based on the predicted total usage duration, the sleep interval and the sleep state of the self-service device in each of the sub-periods may be modified based on the average idle interval.

It should be noted that the sleep interval and the sleep state of the self-service device in each of the sub-periods may be modified based on the average idle interval by the following steps 1 to 4.

In step 1, in a case where the average idle interval is less than a first preset time threshold, the self-service device is controlled not to enter the sleep state.

In step 2, in a case where the average idle interval is greater than or equal to the first preset time threshold and is less than a second preset time threshold, and the self-service device is not used within a first preset sleep interval, the self-service device is controlled to enter a light sleep state. In the light sleep state, a screen of the self-service device is turned off, and a main device of the self-service device is maintained operating normally.

In step 3, in a case where the average idle interval is greater than the second preset time threshold, the self-service device is controlled to enter the light sleep state in a case where the self-service device is not used within the first preset sleep interval, and the self-service device is controlled to enter a deep sleep state in a case where a duration in which the self-service device is in the light sleep state is greater than a second preset sleep interval. In the deep sleep state, the screen of the self-service device is turned off, and the main device of the self-service device enters a lowest power consumption operation state.

In step 4, the self-service device is controlled to enter the deep sleep state, in a case where a current time is in a range of the preset period of time and the self-service device is not used within a third preset sleep interval.

For ease of understanding, examples are given below for detailed description.

In a case where the predicted average idle interval between a time when a user finishes using the self-service device and a time when a next user starts using the self-service device within the sub-period for $x_s$ is less than 5 minutes, the self-service device does not prepare for entering the sleep state.

In a case where the predicted average idle interval between the time when the user finishes using the self-service device and the time when the next user starts using the self-service device within the sub-period for $x_s$ is greater than 5 minutes and less than 30 minutes, and no user uses the self-service device within a modified sleep interval of 3 minutes, the self-service device is modified to enter a light sleep state, in which, a screen of the self-service device is turned off, and the main device such as a CPU of the self-service device is maintained operating normally.

In a case where the predicted average idle interval between the time when the user finishes using the self-service device and the time when the next user starts using the self-service device within the sub-period for $x_s$ is greater than 30 minutes, the self-service device is modified to enter a light sleep state in a case where no user uses the self-service device within the modified sleep interval of 3 minutes. In the light sleep state, the screen of the self-service device is turned off and the main device of the self-service device is maintained operating normally. The self-service device enters a deep sleep state after a modified sleep interval of 10 minutes elapses. In the deep sleep state, the main device may also enter a lowest power consumption operation state.

For example, a usage ratio of the self-service device is extremely low from 11 pm to 6 am. Therefore, the self-service device can be directly modified to enter the deep sleep state in a case where no user uses the self-service device within the modified sleep interval of 3 minutes, thereby ensuring a quick start of the self-service device once a user starts using the self-service device and usage experience of the user, and achieving an energy-saving effect.

According to the present disclosure, the to-be-learned sample information is learned using the Bayesian prior probability to obtain the learning result. The Bayesian prior experience is updated based on the learning result. The number of users which use the self-service device in each of sub-periods of a day is predicted using the updated Bayesian prior experience. The sleep state of the self-service device and the time when the self-service device enters the sleep state are modified based on a prediction result of the updated Bayesian prior experience. In this way, the sleep interval is prolonged in a case of a large number of users, to prevent the device from being started frequently and reduce a fault rate and the maintenance cost of the device, and the sleep interval of the device is shortened in a case of a small number of users, to reduce resource waste and save the cost.

Figure 3:
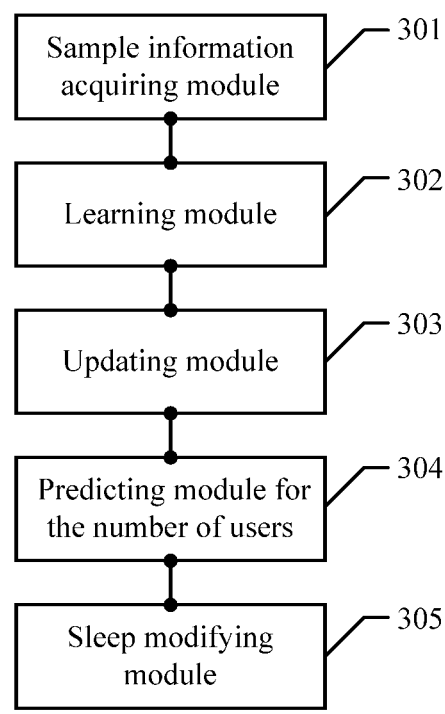
FIG. 3 is a structural diagram of an energy-saving control device for a self-service device according to an embodiment of the present disclosure.

The energy-saving control method for the self-service device is described above. An energy-saving control device for a self-service device is described in detail below. With reference to FIG. 3, an energy-saving control device for a self-service device according to an embodiment of the present disclosure includes a sample information acquiring module 301, a learning module 302, an updating module 303, a predicting module 304 for the number of users and a sleep modifying module 305.

The sample information acquiring module 301 is configured to acquire to-be-learned sample information from historical usage data of users of the self-service device. The sample information indicates the number of users which use the self-service device in each of different sub-periods of a period of time.

The learning module 302 is configured to learn the to-be-learned sample information by using a preset Bayesian prior probability model to obtain a learning result.

The updating module 303 is configured to update the Bayesian prior probability model based on the learning result.

The predicting module 304 for the number of users is configured to predict the number of users in each of sub-periods of a preset period of time by using the updated Bayesian prior probability model, to obtain the predicted number of users at the self-service device.

The sleep modifying module 305 is configured to modify a sleep interval of the self-service device in each of the sub-periods based on the predicted number of users.

In the embodiment, the sample information acquiring module 301 acquires to-be-learned sample information from historical usage data of users of self-service device. The sample information indicates the number of users which use the self-service device in each of different sub-periods of a period of time. The learning module 302 learns the to-be-learned sample information using a preset Bayesian prior probability model to obtain a learning result. The updating module 303 updates the Bayesian prior probability model based on the learning result. The predicting module 304 for the number of users predicts the number of users in each of sub-periods of a preset period of time by using the updated Bayesian prior probability model, to obtain the predicted number of users at the self-service device. The sleep modifying module 305 modifies a sleep interval of the self-service device in each of the sub-periods based on the predicted number of users. In the embodiment, the number of users are predicted using the Bayesian prior probability model obtained by self-learning, and the sleep interval of the self-service device in each of the sub-periods is modified based on the obtained predicted number of users. The sleep interval of the self-service device in each of the sub-periods may be set properly as required, thereby avoiding the problems that the self-service device enters a sleep state or a start state repeatedly in a case of a large number of users due to a too-short sleep interval, and that resources are wasted in a case of a small number of users due to a too-long sleep interval.

Figure 4:
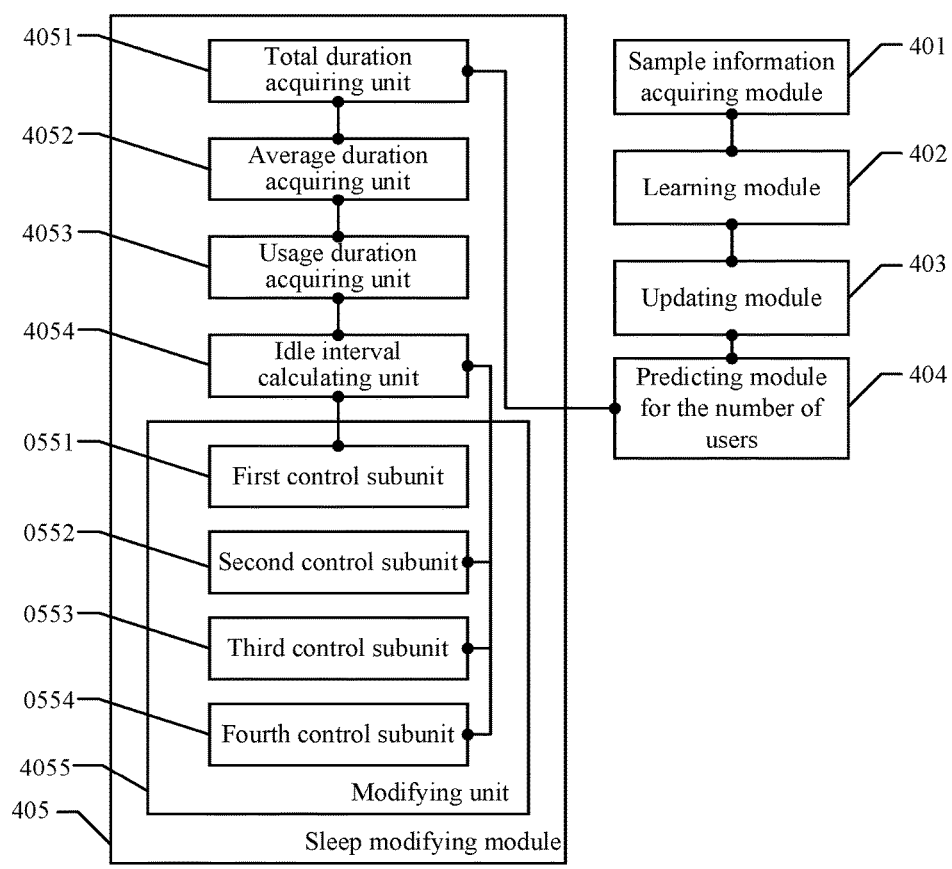
FIG. 4 is a structural diagram of an energy-saving control device for a self-service device according to another embodiment of the present disclosure.

For ease of understanding, the energy-saving control device for the self-service device according to an embodiment of the present disclosure is described in detail below. With reference to FIG. 4, an energy-saving control device for a self-service device according to another embodiment of the present disclosure includes a sample information acquiring module 401, a learning module 402, an updating module 403, a predicting module 404 for the number of users and a sleep modifying module 405.

The sample information acquiring module 401 is configured to acquire to-be-learned sample information from historical usage data of users of the self-service device. The sample information indicates different durations in which different users use the self-service device within a day.

The learning module 402 is configured to learn the to-be-learned sample information using a preset Bayesian prior probability model to obtain a learning result.

The updating module 403 is configured to update the Bayesian prior probability model based on the learning result.

The predicting module 404 for the number of users is configured to predict the number of users in each of sub-periods of a preset period of time by using the updated Bayesian prior probability model, to obtain the predicted number of users at the self-service device.

The sleep modifying module 405 is configured to modify a sleep interval of the self-service device in each of the sub-periods based on the predicted number of users.

In the embodiment, the sleep modifying module 405 may be further configured to modify the sleep interval and a sleep state of the self-service device in each of the sub-periods based on the predicted number of users.

In the embodiment, the sleep modifying module 405 may include a total duration acquiring module 4051, an average duration acquiring unit 4052, a usage duration acquiring unit 4053, an idle interval calculating unit 4054 and a modifying unit 4055.

The total duration acquiring unit 4051 is configured to acquire the sum of durations of all of the users using the self-service device.

The average duration acquiring unit 4052 is configured to calculate an average duration of the user using the self-service device based on the sum of durations.

The usage duration acquiring unit 4053 is configured to acquire a predicted total usage duration based on the predicted number of users and the average duration.

The idle interval calculating unit 4054 is configured to calculate an average idle interval between two adjacent usage for the self-service device within the preset period of time based on the predicted total usage duration.

The modifying unit 4055 is configured to modify a sleep interval and a sleep state of the self-service device in each of the sub-periods based on the average idle interval.

In the embodiment, the modifying unit 4055 may include a first control subunit 0551, a second control subunit 0552, a third control subunit 0553 and a fourth control subunit 0554.

The first control subunit 0551 is configured to control the self-service device not to enter the sleep state in a case where the average idle interval is less than a first preset time threshold.

The second control subunit 0552 is configured to control the self-service device to enter a light sleep state, in a case where the average idle interval is greater than or equal to the first preset time threshold and is less than a second preset time threshold and the self-service device is not used within a first preset time limit. In the light sleep state, a screen of the self-service device is turned off and a main device of the self-service device is maintained operating normally.

The third control subunit 0553 is configured to, in a case where the average idle interval is greater than the second preset time threshold, control the self-service device to enter the light sleep state in a case where the self-service device is not used within the first preset time limit, and control the self-service device to enter a deep sleep state in a case where a duration within which the self-service device is in the light sleep state is greater than a second preset time limit. In the deep sleep state, the screen of the self-service device is turned off and the main device of the self-service device enters a lowest power consumption operation state.

The fourth control subunit 0554 is configured to control the self-service device to enter the deep sleep state in a case where a current time is in a range of the preset period of time and the self-service device is not used within a third preset time limit.

It may be clearly understood by those skilled in the art that, for convenience and ease of description, operating processes of the system, the device and the unit described above may refer to the corresponding processes in the above method embodiments, which are not described hereinafter anymore.

In several embodiments according to the present disclosure, it should be understood that the disclosed system, device and method can be implemented in other ways. The device embodiments described above are merely schematic. For example, the division of the units is merely a logic functional division, and there may be other divisions in practice. For example, multiple units or components may be combined, or may be integrated into another system, or some features may be ignored or not be executed. In addition, coupling, direct coupling or communication connection between components shown or discussed may be indirect coupling or communication connection via some interfaces, devices or units, which may be electrical, mechanical, or in other form.

The units illustrated as separate components may be or may not be separated physically, and the component displayed as a unit may be or may not be a physical unit. That is, the components may be located at the same place, or may be distributed on multiple network units. Some or all of the units may be selected as required to implement the objective of the solution of the embodiments.

In addition, all function units according to the embodiments of the present disclosure may be integrated into one processing unit, or may be each a separate unit physically, or two or more units are integrated into one unit. The integrated unit described above may be realized with hardware, or may be realized by a software function unit.

The integrated unit may be stored in a computer readable storage medium if the integrated unit is implemented in the form of a software function unit and is sold or used as a separate product. Base on such understanding, an essential part of the technical solution of the present disclosure, i.e., the part of the technical solution of the present disclosure that contributes to the conventional technology, or all or a part of the technical solution may be embodied in the form of a computer software product. The computer software product is stored in a storage medium, and includes several instructions to instructing a computer device (which may be a personal computer, a server, a network device or the like) to implement all or a part of steps of the method according to the embodiments of the present disclosure. The storage medium described above includes various mediums which can store program codes such as a USB disk, a mobile hard disk, a read-only memory (ROM), a random access memory (RAM), a magnetic disk and an optical disc.

In summary, the above embodiments are only described for illustrating the technical solutions of the present disclosure, and not for limiting the technical solutions. Although the present disclosure is illustrated in detail by referring to the aforementioned embodiments, it should be understood by those skilled in the art that modifications can be still made to the technical solutions recited in the aforementioned embodiments, or equivalent substitution can be made to a part of technical features of the technical solutions. The modification and equivalent substitution cannot make essence of the technical solutions depart from the spirit and a scope of the technical solutions according to the embodiments of the present disclosure.

The invention claimed is:

1. An energy-saving control method for a self-service device, comprising:
   acquiring to-be-learned sample information from historical usage data of users of the self-service device, wherein the sample information indicates the number of users which use the self-service device in each of different sub-periods of a period of time;
   learning the to-be-learned sample information by using a preset Bayesian prior probability model, to obtain a learning result;
   updating the Bayesian prior probability model based on the learning result;
   predicting the number of users in each of sub-periods of a preset period of time by using the updated Bayesian prior probability model, to obtain the predicted number of users at the self-service device; and
   modifying a sleep interval of the self-service device in each of the sub-periods based on the predicted number of users,
   wherein the Bayesian prior probability model is obtained by the following preprocessing steps:
      preprocessing the historical usage data of the users of the self-service device, to acquire the number of users which use the self-service device in each of the different sub-periods of the period of time as sample information;
      collating the sample information based on division for the period of time, to obtain prior sample information; and
      obtaining the Bayesian prior probability model based on Bayes rules and the prior sample information.

2. The method according to claim 1, wherein the to-be-learned sample information is updated into the prior sample information once the to-be-learned sample information is acquired.

3. The method according to claim 1, wherein the Bayesian prior probability model $P(x_s)$ is represented as:

$$P(x_s) = Dir(\alpha_1, \alpha_2, \cdots, \alpha_s) = \frac{\Gamma(\alpha)}{\prod_s \Gamma(\alpha_s)} \prod_s (x_s)^{\alpha_s - 1},$$

where $Dir(\alpha_1, \alpha_2, \ldots, \alpha_s)$ denotes a Dirichlet distribution, s denotes the number of the sub-periods of the period of time, $x_s$ denotes the number of users in the sample information in an s-th sub-period, $\alpha_s$ denotes the number of pieces of the sample information in the s-th sub-period, and $$\alpha = \sum_{s=1}^{s} \alpha_s.$$

4. The method according to claim 3, wherein the updated Bayesian prior probability model $P'(x_s)$ is represented as:

$$P'(x_s) = \frac{x_s + x'_s}{n} = \frac{x_s + x'_s}{\sum_{s=1}^{s}(x_s + x'_s)},$$

and
the number of pieces of updated sample information is represented as:

$$n = \sum_{s=1}^{s}(x_s + x'_s); x_s, x'_s = 0, 1, 2, \cdots, m,$$

where $x'_s$ denotes the number of users in the to-be-learned sample information in each of the sub-periods, and $x_s$ denotes the number of users in the sample information in the s-th sub-period.

5. The method according to claim 1, further comprising:
modifying a sleep state corresponding to the sleep interval of the self-service device when the sleep interval of the self-service device in each of the sub-periods is modified based on the predicted number of users.

6. The method according to claim 5, wherein the modifying the sleep interval and the sleep state corresponding to the sleep interval of the self-service device in each of the sub-periods based on the predicted number of users comprises:
acquiring the sum of durations of all of the users using the self-service device;
calculating an average duration of the user using the self-service device based on the sum of durations;
acquiring a predicted total usage duration based on the predicted number of users and the average duration;
calculating an average idle interval between two adjacent usage for the self-service device within the preset period of time based on the predicted total usage duration; and
modifying, based on the average idle interval, the sleep interval and the sleep state corresponding to the sleep interval of the self-service device in each of the sub-periods.

7. The method according to claim 6, wherein the modifying, based on the average idle interval, the sleep interval and the sleep state corresponding to the sleep interval of the self-service device in each of the sub-periods comprises:
in a case where the average idle interval is less than a first preset time threshold, controlling the self-service device not to enter a sleep state;
in a case where the average idle interval is greater than or equal to the first preset time threshold and is less than a second preset time threshold, and the self-service device is not used within a first preset sleep interval, controlling the self-service device to enter a light sleep state, wherein in the light sleep state, a screen of the self-service device is turned off, and a main device of the self-service device is maintained operating normally; and
in a case where the average idle interval is greater than the second preset time threshold, controlling the self-service device to enter the light sleep state in a case where the self-service device is not used within the first preset sleep interval, and controlling the self-service device to enter a deep sleep state in a case where a duration in which the self-service device is in the light sleep state is greater than a second preset sleep interval, wherein in the deep sleep state, the screen of the self-service device is turned off and the main device of the self-service device enters a lowest power consumption operation state.

8. The method according to claim 7, wherein the modifying, based on the average idle interval, the sleep interval and the sleep state corresponding to the sleep interval of the self-service device in each of the sub-periods further comprises:
controlling the self-service device to enter the deep sleep state in a case where a current time is in a range of the preset period of time and the self-service device is not used within a third preset sleep interval.

9. An energy-saving control device for a self-service device, comprising:
a sample information acquiring module configured to acquire to-be-learned sample information from historical usage data of users of the self-service device, wherein the sample information indicates the number of users which use the self-service device in each of different sub-periods of a period of time;
a learning module configured to learn the to-be-learned sample information by using a preset Bayesian prior probability model, to obtain a learning result;
an updating module configured to update the Bayesian prior probability model based on the learning result;
a predicting module for the number of users configured to predict the number of users in each of sub-periods of a preset period of time by using the updated Bayesian prior probability model, to obtain the predicted number of users at the self-service device; and
a sleep modifying module configured to modify a sleep interval of the self-service device in each of the sub-periods based on the predicted number of users,
wherein the Bayesian prior probability model is obtained by the following preprocessing steps:
preprocessing the historical usage data of the users of the self-service device, to acquire the number of users which use the self-service device in each of the different sub-periods of the period of time as sample information;
collating the sample information based on division for the period of time, to obtain prior sample information; and
obtaining the Bayesian prior probability model based on Bayes rules and the prior sample information.

* * * * *